United States Patent
Onno et al.

(10) Patent No.: US 7,957,706 B2
(45) Date of Patent: *Jun. 7, 2011

(54) COMBINED MATCHING AND FILTER CIRCUIT

(75) Inventors: Peter Onno, Glen Haven (CA); Rajanish, San Diego, CA (US); Nitin Jain, San Diego, CA (US); Christopher D. Weigand, Woburn, MA (US)

(73) Assignee: M/A-COM Technology Solutions Holdings, Inc., Lowell, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/701,837

(22) Filed: Feb. 8, 2010

(65) Prior Publication Data
US 2010/0201456 A1    Aug. 12, 2010

Related U.S. Application Data

(63) Continuation of application No. 10/872,947, filed on Jun. 21, 2004, now Pat. No. 7,660,562.

(51) Int. Cl.
  *H04B 1/04*    (2006.01)
  *H03H 7/38*    (2006.01)
(52) U.S. Cl. ............... 455/114.1; 333/32; 333/176
(58) Field of Classification Search .......... 455/73, 455/114.1, 114.2, 80, 307, 129; 333/32, 333/24 R, 143, 176, 202–212, 167, 175, 184; 330/251, 286, 306
See application file for complete search history.

(56) References Cited

U.S. PATENT DOCUMENTS

| | | | | |
|---|---|---|---|---|
| 2,982,928 A * | 5/1961 | Kall et al. | | 333/167 |
| 3,271,705 A * | 9/1966 | Karkar | | 333/176 |
| 3,461,372 A * | 8/1969 | Barton et al. | | 363/40 |
| 3,859,542 A * | 1/1975 | Kennedy | | 307/401 |
| 4,433,315 A * | 2/1984 | Vandegraaf | | 333/174 |
| 4,717,884 A * | 1/1988 | Mitzlaff | | 330/251 |
| 4,888,568 A * | 12/1989 | Kawaguchi | | 333/174 |
| 5,095,285 A * | 3/1992 | Khatibzadeh | | 330/306 |
| 5,146,178 A * | 9/1992 | Nojima et al. | | 330/251 |
| 5,300,895 A * | 4/1994 | Jones | | 330/251 |
| 5,347,229 A * | 9/1994 | Suckling et al. | | 330/251 |
| 5,352,990 A * | 10/1994 | Goto | | 330/286 |
| 5,619,080 A * | 4/1997 | Pennington et al. | | 307/105 |
| 5,969,582 A * | 10/1999 | Boesch et al. | | 333/129 |
| 5,973,568 A * | 10/1999 | Shapiro et al. | | 330/295 |
| 6,177,841 B1 * | 1/2001 | Ohta et al. | | 330/302 |
| 6,195,536 B1 * | 2/2001 | Peckham et al. | | 455/127.4 |
| 6,236,274 B1 * | 5/2001 | Liu | | 330/302 |
| 6,301,467 B1 * | 10/2001 | Jarvinen et al. | | 455/80 |
| 6,577,199 B2 * | 6/2003 | Dent | | 330/302 |
| 6,587,018 B1 * | 7/2003 | Meck et al. | | 333/175 |
| 6,879,209 B2 * | 4/2005 | Grundlingh | | 330/251 |

(Continued)

*Primary Examiner* — Blane J Jackson
(74) *Attorney, Agent, or Firm* — Christopher P. Maiorana, PC

(57) ABSTRACT

A combined matching and harmonic rejection circuit with increased harmonic rejection provided by a split resonance for one or more of the capacitive or inductive elements of the circuit. At a fundamental frequency, the circuit comprises an inductive series arm with capacitive shunt arms. The capacitance of a shunt arm may be provided by two or more parallel paths, each having a capacitor and an inductor in series so that, in addition to providing the effective capacitance necessary for impedance matching at the fundamental frequency, two separate harmonics represented by the series resonances of the parallel paths are rejected. In this manner, an extra null in the circuit's stop-band may be achieved using the same number of shunt elements necessary to achieve impedance matching at the fundamental frequency.

13 Claims, 6 Drawing Sheets

U.S. PATENT DOCUMENTS

| | | | |
|---|---|---|---|
| 7,015,870 B2 * | 3/2006 | Guitton et al. | 343/860 |
| 7,161,434 B2 * | 1/2007 | Rhodes | 330/302 |
| 2002/0101284 A1 * | 8/2002 | Kee et al. | 330/251 |
| 2003/0011443 A1 * | 1/2003 | Liu et al. | 333/126 |
| 2004/0116082 A1 * | 6/2004 | Choi | 455/121 |
| 2005/0104679 A1 * | 5/2005 | Blednov | 333/32 |

* cited by examiner

COMBINED MATCHING AND FILTER CIRCUIT

This is a continuation of U.S. Ser. No. 10/872,947, filed Jun. 21, 2004 now U.S. Pat. No. 7,660,562, which is incorporated by reference.

FIELD OF THE INVENTION

The present invention relates to impedance matching and harmonic filtering for power amplifiers, and in particular to impedance matching and harmonic filtering for cellular phone transmission amplifiers.

BACKGROUND OF THE INVENTION

Cellular phones typically transmit at radio frequencies (RF) in the 1 to 5 GHz range. At these frequencies, transmission lines have an impedance of approximately 50 Ohms, while typical cellular phone transmission power amplifiers have output impedances in the range of 1 to 5 Ohms. Cellular phones therefore require an impedance matching circuit between their power amplifiers and transmission lines.

In addition, regulatory bodies such as the Federal Communications Commission (FCC) have strict regulations regarding harmonic suppression in cellular phones. This suppression, if properly implemented, prevents cellular phone use from interfering with communications equipment operating at the higher frequencies harmonics.

Traditionally, cellular phone handsets have been manufactured to meet these two requirements by having two separate circuits, one for impedance matching and one for harmonic suppression. It is also usual to construct each circuit using discrete passive elements, i.e. inductors, capacitors and chip resistors, mounted on printed circuit (PC) boards, because of the typical capacitor and inductor values required by such separate circuits.

Circuits made using discrete components tend to be large and bulky. Moreover, multilayer PC board ground effects tend to introduce excess inductances that make obtaining the required level of harmonic suppression difficult. It is therefore desirable to have circuit designs in which the inductance and capacitance values allow monolithic integrated circuit implementation, as the associated batch manufacturing processes are less expensive, while the resultant circuits avoid the inductance problems associated with PC boards and are smaller and less bulky.

Another approach to reducing the size of a low loss circuit is to combine the impedance matching and filtering functions into a single circuit. This can be done, for instance, by first designing a circuit that matches input impedance to output load at a particular transmission frequency (also referred to as the fundamental frequency). A low loss, minimum delay version of such an impedance matching circuit typically consists of at least one series arm, having several inductors, and at least one shunt arm, consisting of capacitors. By suitable choice of capacitor and inductor values, input and output impedance can be matched at the fundamental frequency. It is also possible to replace a shunt capacitor with a somewhat smaller capacitor and a suitably chosen inductor connected in series. At the fundamental frequency the capacitor/inductor pair behaves essentially like the original, somewhat larger shunt capacitor. Not only does this reduce the size of the required capacitor, but the capacitor/inductor pair may also be used as a harmonic filter. This additional benefit is possible because a capacitor/inductor pair connected in series has a resonance frequency (also known as the series resonance frequency) at which the combination essentially acts as a short circuit. If the capacitor and inductor values are chosen judiciously, this series resonance can be made to occur at a harmonic of the fundamental frequency. The shunt capacitance element of the matching circuit then also acts as a harmonic filter by essentially becoming a short circuit to ground at the harmonic frequency, thereby preventing transmission of that frequency to the output.

A problem of designing such combined impedance matching and filtering circuits (also known as matching filter circuits) is that there are a limited number of shunt elements in a typical matching circuit. Effective harmonic suppression requires filtering at multiple harmonics. Moreover, a capacitor/inductor series resonance typically has a high quality factor (Q), i.e. the width of the resonance is narrow. One way to improve the bandwidth of such filters is to have two or more capacitor/inductor series resonance filters, each offset by a suitably small frequency, on either side of the harmonic frequency being filtered. Such designs require a relatively large number of filter elements. The problem, therefore, is how to design a matching filter circuit having a sufficient number of filters (also known as harmonic traps) to provide the required level of harmonic rejection, given the limited number of conductive shunt arms in a typical, low loss minimum delay matching circuit.

SUMMARY OF THE INVENTION

Briefly described, the invention provides a combined impedance matching and harmonic rejection circuit (also known as a matching filter circuit) having increased harmonic rejection capability. The increased harmonic rejection of the circuit is achieved by providing a split, or dual, resonance for one or more of the capacitive or inductive elements of the circuit.

In one embodiment, the matching filter circuit comprises a series arm, which, at the fundamental frequency, is essentially a series of inductors, with one or more shunt arms, which, at the fundamental frequency, are essentially capacitors. The first shunt arm requires a certain capacitance (the impedance-matching-required capacitance) for the circuit to achieve impedance matching at the fundamental frequency for which the circuit is designed. By providing that match-required capacitance using two parallel paths, each having a capacitor and an inductor in series, the matching filter circuit can be made to reject two separate harmonics represented by the series resonance of each of the parallel paths. In this manner, an extra null in the stop-bands of the circuit can be achieved using the same number of shunt elements necessary to achieve impedance matching at the fundamental frequency for which the circuit is designed.

An objective of the design is to provide matching filters with increased harmonic suppression in a more compact design that is capable of being implemented as a monolithic circuit suitable for low cost, batch manufacture.

These and other features of the invention will be more fully understood by reference to the following drawings.

DETAILED DESCRIPTION

The present invention provides for combining impedance matching and harmonic filtering functions into a single match-and-filter circuit in a way that significantly improves the harmonic filtering. The invention will now be described in more detail by reference to the attached figures in which like numbers refer to like elements.

Figure 1:
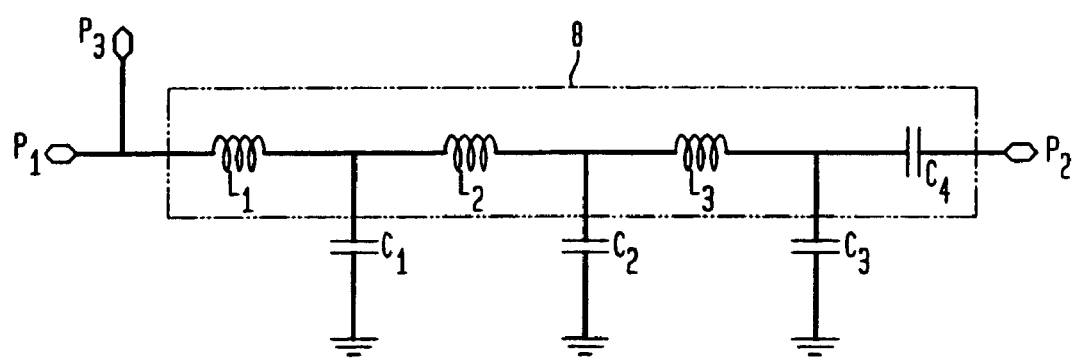
FIG. 1 is a circuit diagram of an impedance matching circuit operation at a single, fundamental frequency.

FIG. 1 is a circuit diagram of an impedance matching circuit, designed to operate at a single, fundamental frequency. The circuit has an inductive series arm 8, comprising inductors L1, L2 and L3 in series and capacitor C4. The circuit also has capacitive shunt arms, each arm including a separate capacitor C1, C2, and C3. Components L1, L2, L3, C1, C2 and C3 are chosen so that the circuit has a first effective impedance "A" at port P1 and a second, effective impedance "B" at port P2. In this way the circuit can, for instance, match an amplifier having an output impedance "A", to a transmission line having an input impedance "B". Capacitor C4 is included so that an amplifier bias feed can be applied at port P3 without any direct current getting to port P2.

Figure 2:
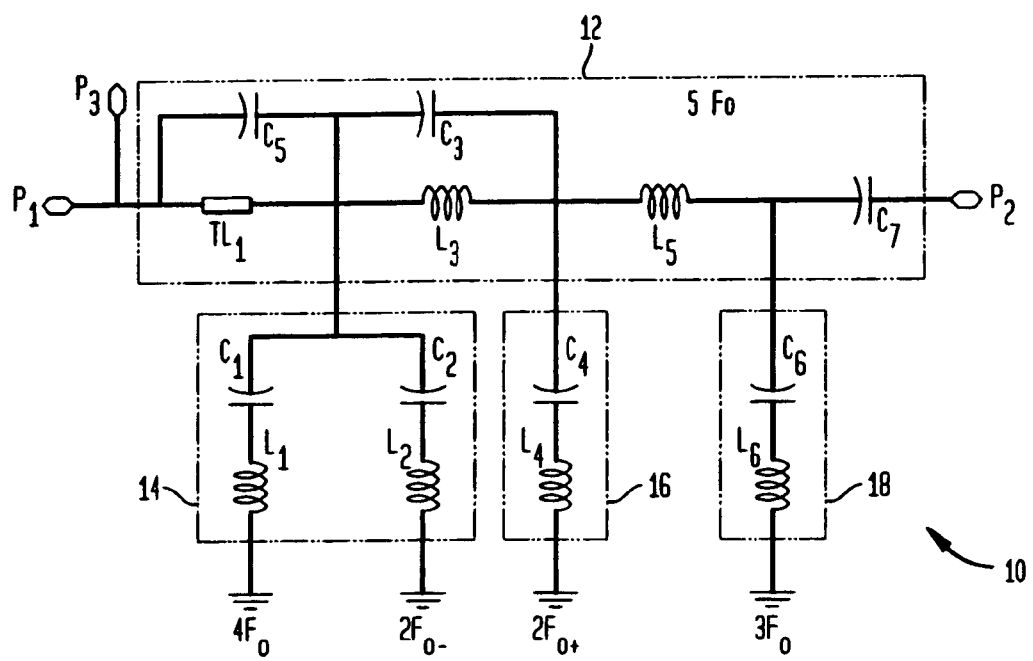
FIG. 2 is a circuit diagram of a matching filter circuit with capacitance split shunt resonance, exemplifying the inventive concepts of one embodiment of the present invention.

FIG. 2 is a circuit diagram of a matching filter 10, with capacitance split shunt resonance, exemplifying the inventive concepts of one embodiment of the present invention. The matching filter 10, is a low-loss, minimum-delay filter comprising an input port P1, an output port P2, an amplifier bias-power port P3, a series arm, indicated by dashed box 12, comprising transmission line TL1, inductors L3 and L5 as well as capacitors C5, C3 and C7, and shunt arms, indicated by dashed boxes 14, 16 and 18, comprising capacitors C1, C2, C4 and C6 as well as inductors L1, L2, L4 and L6. Transmission line TL1 feeds the input signal from input port P1 to the matching circuit, and acts substantially like an inductor. Although capacitors C1-C6 and inductors L1-L6 may be discrete passive elements, in a preferred embodiment, they are formed as part of a monolithic integrated circuit, using any of the well known technologies for producing such integrated circuits. The components of matching filter 10 are chosen so that the output impedance of a power amplifier connected to input port P1 is matched to the transmission line attached to output port P2 at a fundamental or transmission frequency $F_0$.

In a typical cellular phone application, the transmission frequency $F_0$ is in the range of 0.8 to 5 GHz. For instance, the well-known Advanced Mobile Phone System (AMPS) standard uses a transmission frequency in the region of 850 MHz (0.85 GHz), the Global System for Mobile Communications (GSM) standard uses a transmission frequency in the region of 900 MHz (0.9 GHz), the Digital Cellular System (DCS) standard uses a transmission frequency in the region of 1.8 GHz and the Personal Communications System (PCS) standard uses a frequency in the region of 1.9 GHz.

In a typical cellular phone application, input port P1 is connected to the output of a power amplifier having an output impedance in the range of 1-5 Ohms. For instance, a typical power amplifier operating at the GSM frequency of 900 MHz has an output impedance of about 1.5 Ohms, while, at the DCS frequency of 1.8 GHz, a typical power amplifier output impedance is 2.5 Ohms. This has to be matched to an output transmission line having an impedance of about 50 Ohms connected to output port P2. Port P3 is used to provide DC bias voltage to the power amplifier connected to input port P1. Blocking capacitor C7 prevents this DC bias voltage from reaching output port P2.

At the fundamental frequency $F_0$, the impedance matching of circuit 10 may be approximated as a series arm consisting of transmission line TL1 followed by two inductors L3 and L5, with three shunt arms having capacitances roughly equal to the values of capacitors C1+C2, C4 and C6. The component values may be approximately calculated by well known impedance matching formulas and algorithms. (The values calculated in this manner may be made more accurate by, for instance, further considering the reduction in capacitance at the fundamental frequency due to series inductors L1, L2, L4 and L6 as well as the increase in inductance of L3 due to parallel capacitor C3).

In a preferred embodiment, sufficient harmonic suppression to meet FCC rules may be provided by having broad suppression at frequencies in the vicinity of the second harmonic ($2F_0$) combined with suppression of harmonics up to the fifth harmonic, i.e., at frequencies in the vicinity of $3F_0$, $4F_0$ and $5F_0$. If the broad suppression (also known as providing a wider band of rejection) of the second harmonic is achieved by having filters (also known as harmonic traps) at a frequency $2F_0+$, just above the second harmonic, and at a frequency $2F_0-$, just below the second harmonic, there is a requirement for a total of five filters from a circuit that has only three shunt arms.

In a preferred embodiment of the invention, a solution is to provide two of the required filters by means of a split shunt resonance. A split shunt resonance is formed from a single shunt arm 14 by splitting that shunt arm into two paths, as is done with the first shunt arm in FIG. 2. The first shunt arm 14 in FIG. 2 comprises two paths of capacitor/inductor pairs, the pairs being C1/L1 and C2/L2. In a preferred embodiment C1 and L1 are chosen to have a series resonance at a frequency in the vicinity of four times the fundamental frequency ($4F_0$) and thereby provide a harmonic filter for the fourth harmonic by effectively shorting any signal in the vicinity of that frequency to ground. Similarly, C2 and L2 are chosen to have a series resonance at a frequency $2F_0-$, just slightly less than twice the fundamental frequency and thereby provide part of a second harmonic filter by effectively shorting any signal in the vicinity of that frequency to ground. The values of C1, L1, C2 and L2 are also required to combine to form a first, impedance-matching-required, effective capacitance at the fundamental frequency, $F_0$.

A further restriction is that the shunt arm circuit element 14, comprised of the circuit elements C1, L1, C2 and L2, also has a parallel resonance frequency Fp, at a frequency somewhere between the filter frequencies of $2F_0-$ and $4F_0$. At this parallel resonance frequency, the first shunt arm is effectively an open circuit. Therefore, this resonance should be placed at a frequency where it is benign with respect to required circuit functionality. This may be accomplished by, for instance, selecting values for the components so as to place the parallel resonance in the vicinity of the frequency of another harmonic trap in the circuit, such as a third harmonic trap provided, by the shunt arm 18, comprising the elements C6 and L6.

The values of C1, L1, C2 and L2 may be obtained by starting with values indicated by well known circuit design equations and algorithms, placing these values in well known circuit simulation software and observing the predicted circuit behavior. Component values can then be iteratively adjusted to produce the required behavior at the various frequencies.

In a preferred embodiment, filtering of the third harmonic ($3F_O$) and widening of the second harmonic ($2F_O$) rejection may be achieved by providing harmonic traps on the second and third capacitance shunt arms, 16 and 18. The second shunt arm components C4 and L4 may, for instance, be chosen to have both a required capacitance at the transmission frequency $F_O$ and a series resonance at a frequency $2F_O+$, just above the second harmonic, thereby providing part of a second harmonic filter by effectively shorting any signal in the vicinity of that frequency to ground. This second shunt arm 16 portion of the second harmonic filter in the vicinity of frequency $2F_O+$, combines with the portion of the second harmonic filter in the vicinity of frequency $2F_O-$, in the first shunt arm, to provide broad rejection of signals in the vicinity of the second harmonic frequency $2F_O$. The third shunt arm 18 components C6 and L6 may, for instance, be chosen to have both an impedance-matching-required, effective capacitance at the transmission frequency $F_O$ and a series resonance at $3F_O$, thereby providing a third harmonic filter by effectively shorting any signal in the vicinity of that frequency to ground.

In a preferred embodiment, fifth harmonic ($5F_O$) rejection may be achieved by, for instance, placing a harmonic trap in the series arm of the circuit using the open circuit, parallel resonance of an inductor and capacitor in series, as shown by elements L3 and C3. These series arm components may be chosen to have a required inductance at the transmission frequency $F_O$ and to have a parallel resonance at a frequency in the vicinity of five times the fundamental frequency $5F_O$, thereby providing a fifth harmonic filter by effectively becoming an open circuit with large (ideally infinite) impedance at that frequency, preventing any signal in the vicinity of that frequency from being transmitted.

In FIG. 2, the transmission line TL1 is required to transfer the signal from the input port to capacitors C1 and C2 and inductor L3. In a practical implementation capacitor C5 is placed in parallel with TL1 to increase the effective inductance of the transmission line TL1 at the second harmonic frequency ($2F_O$). In particular, it is chosen to provide suitable impedance for the power amplifier in the vicinity of this frequency.

Exemplary values for the components of FIG. 2 to implement an impedance matching and harmonic filtering circuit operating at a transmission or fundamental frequency of about 800 MHz include the following values: C1 about 6.25 pF, L1 about 0.33 nH, C2 about 31.25 pF, L2 about 0.22 nH, C3 about 0.5 pF, L3 about 1.78 nH, C4 about 6.3 pF, L4 about 1.45 nH, C5 about 1 pF, C6 about 4.3 pF, L6 about 0.87 nH, C7 about 30 pF.

Figure 3:
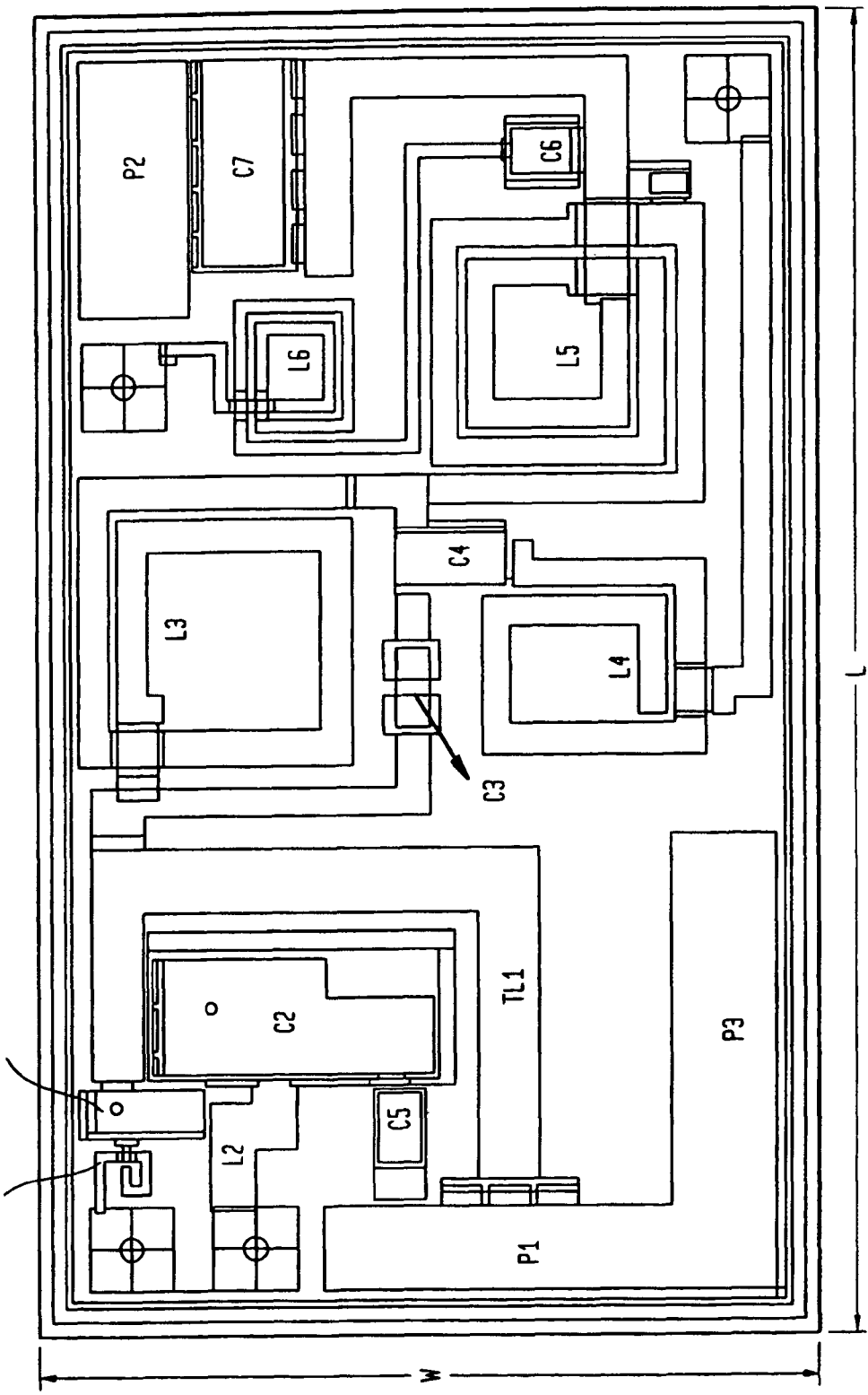
FIG. 3 is a circuit layout diagram of a matching filter circuit exemplifying the inventive concepts of one embodiment of the present invention.

FIG. 3 is a circuit layout diagram of a matching filter circuit exemplifying the inventive concepts of one embodiment of the present invention. FIG. 3 shows the filter matching circuit 10 implemented as a monolithic integrated circuit. The implementation may be undertaken using any well-known integrated circuit fabrication technology, including the use of gallium arsenide (GaAs) technology. The circuit of FIG. 3 may be implemented using for instance, a layer of GaAs that is 6 mils thick with a total length L, of about 2.2 mm and a width W, of about 1.38 mm. The pad P1 may be a metallic pad, intended for wire bonding to the output of a power amplifier. Pad P3 may then be used, in conjunction with appropriate inductors, to supply bias voltage to the output of the attached power amplifier, thereby allowing a simplified bias injection circuit on the power amplifier.

The elements in FIG. 3 correspond to like labeled elements in FIG. 2. In the layout of matching filter 10 shown in FIG. 3, inductor L3 is shown close to L6 and similarly inductor L4 is shown close to L5. With such a compact layout, there will be mutual inductance between these inductors which will depend both on the proximity and the winding sense of each inductor relative to the others. This mutual inductance will affect the performance of the overall matching filter 10. By using well-known electro-magnetic (EM) modeling and circuit performance prediction models that incorporate mutual inductance, the required values of the components can be arrived at by repetitive iterations in which performance-versus-frequency is fine-tuned by empirically adjusting component values starting from, for instance, a design calculated analytically using approximations such as, but not limited to, zero mutual inductance.

Figure 4:
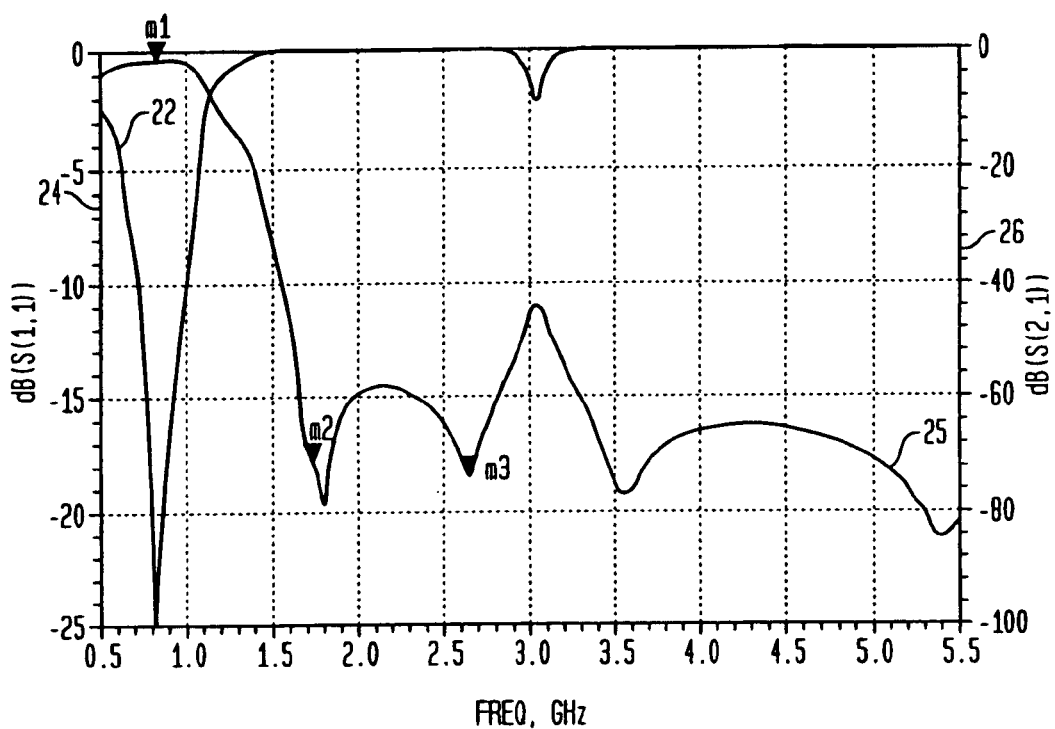
FIG. 4 is a plot of the S11 and S21 scattering parameters versus frequency for the circuit of FIG. 1.

FIG. 4 is a plot of the S11 and S21 scattering parameters as a function of frequency for the shunt capacitance split resonance circuit of FIG. 2. Curve 25 is the S21 scattering curve that effectively shows the amount of signal that gets into the next device, i.e. the device attached to output terminal P2, by displaying the amount of the incident signal that passes through the filter. The higher the value of S21 as measured in the vertical axis using scale 26, the more signal that gets to the next device via terminal P2. For instance, a zero reading for S21 indicates that all of the signal is transmitted through the circuit and reaches P2. At a frequency m1 of 825 MHz, S21 is about −1.274 dB, indicating that, at this frequency, most of the signal is being transmitted to the next device. In the vicinity of the second harmonic frequency, most of the signal is reflected back, as shown at frequency m2 of 1.7 GHz where the S21 value is −71.575 dB, indicating that almost no signal reaches the next device via output P2.

Curve 22 of FIG. 4 is an S11 curve showing how much power is reflected by the circuit, as measured on the scale 24. As the matching filtering 10 is a passive device, the maximum power throughput is 1 (1 may also be represented as 0 dB). In the vicinity of the design transmission frequency of 825 MHz, marked as $m_1$, the power reflected back by the device as indicated by the S11 curve 22 is approximately −25 dB, indicating very little power reflected by the device. In the vicinity of the second harmonic frequency, at the frequency of 1.7 GHz, marked by $m_2$, the S11 value is approximately −1 dB, indicating that most of the power is reflected by the device at this frequency. Similarly, in the vicinity of the third harmonic, very little power flows through the circuit as shown by the S21 value of −74.066 dB at the frequency of 2.625 GHz, marked as $m_3$.

Figure 5:
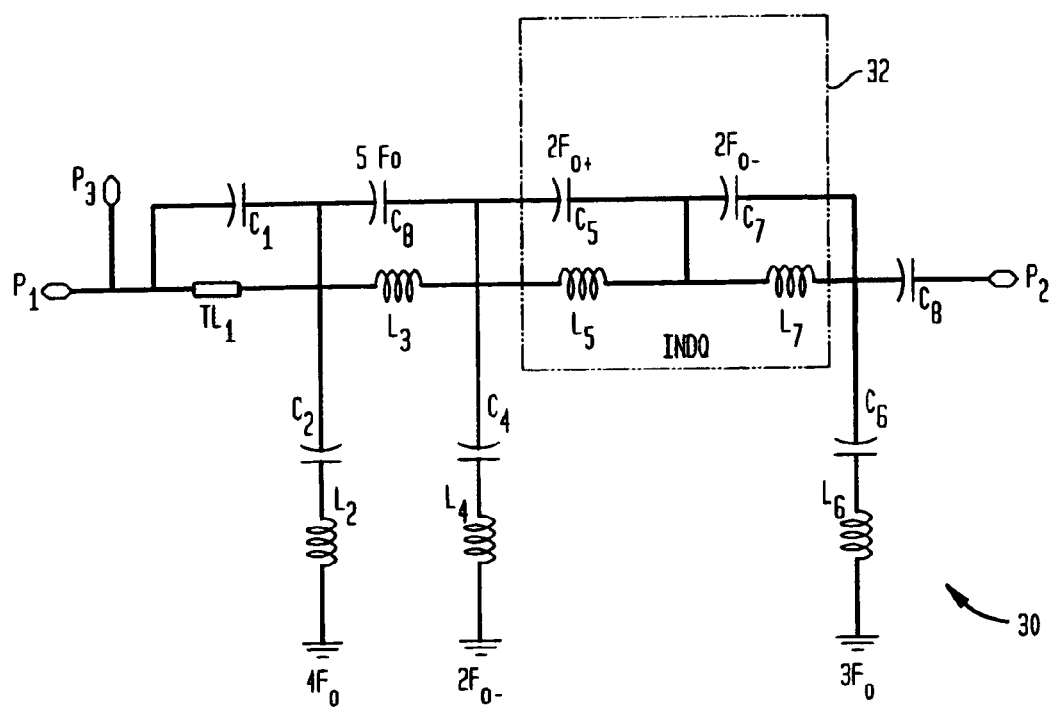
FIG. 5 is a circuit diagram of a matching filter circuit with inductive split dual resonance, exemplifying the inventive concepts of one embodiment of the present invention.

FIG. 5 is a circuit diagram of a matching filter with inductive split dual resonance, exemplifying the inventive concepts of one embodiment of the present invention. The matching filter 30 may initially be approximated by an impedance matching circuit operating at the transmission frequency ($F_O$), having a series arm comprising transmission line TL1, and inductances given by inductors L3 and L5+L7, and three shunt arms having capacitances given by capacitors C2, C4 and C6.

The harmonic filtering function of the circuit may be incorporated by, for instance, implementing each of the shunt arm capacitances as a capacitor and inductor in series, as shown by capacitor/inductor pairs C2/L2, C4/L4 and C6/L6. By judicious choice of the inductors, the capacitor/inductor pair may satisfy the capacitance requirements at $F_O$, and have a series resonance that creates a harmonic trap at a second frequency by effectively functioning as a closed circuit (also known as a short circuit) at that second frequency. For instance, C2/L2 may be chosen to series resonate at $4F_O$, C4/L4 may be chosen to series resonate at $2F_0-$, and C6/L6 may be chosen to series resonate at $4F_0$, thereby creating harmonic filters at these frequencies by effectively becoming a closed circuit and shorting any signal in the vicinity of those frequencies to ground.

Additional harmonic filtering may be accomplished by parallel resonances that create open circuit conditions. For instance, C3 and L3 may be chosen so that, in addition to providing the required effective inductance at $F_0$, the inductor/capacitor pair parallel resonate at a second frequency, thereby effectively blocking any signal in the vicinity of that second frequency.

In order to provide more resonance traps and to broaden the bandwidth of others, the parallel resonance can be split as shown by the circuit elements C5, L5, C7 and L7 in FIG. 5. L5 and L7 are chosen to provide appropriate inductance for the impedance matching function at $F_0$. By splitting the total inductance into two components, it is then possible to have two separate parallel resonance filters in series, one at the parallel resonance frequency of C5 and L5 and one at the parallel resonance frequency of C7 and L7. In FIG. 5, these parallel resonance frequencies are chosen to be $2F_0+$ and $2F_0--$, thereby providing a broader bandwidth filter in the vicinity of the second harmonic of the fundamental or transmission frequency.

An important factor in such a series inductance split dual resonance 32, is that, between the two parallel resonances, there is effectively a series resonance frequency at which the combined elements act as a closed circuit. To prevent harmonic leakage at this frequency it is important to also include a shunt filter at this frequency. In circuit 30 this matching shunt filter is provided by capacitor/inductor pair C4/L4.

In FIG. 5, the transmission line TL1 is required to transfer the signal from the input port to the inductor L3 and the capacitors C3 and C2. Capacitor C1 in parallel with transmission line TL1 is chosen so that, at the series resonance frequency of the first shunt arm, i.e., the series resonance of capacitor C2 and inductor L2, the effective impedance of transmission line TL1 is suitable as an output for the power amplifier attached at P1.

In FIG. 5, capacitor C8 is a blocking capacitor that prevents current leakage to output port P2 from any DC bias voltage applied at port P3. DC voltage may be applied at port P3 as, for instance, bias voltage for the power amplifier attached to input port P1.

Exemplary values for the components required to implement an impedance matching and harmonic filter 30, operating at a transmission or fundamental frequency of about 800 MHz, include the following values C1 about 1 pF, C2 about 44 pF, L2 about 0.05 nH, C3 about 0.5 pF, L3 about 1.78 nH, C4 about 6.3 pF, L4 about 1.45 nH, C5 about 5 pF, L5 of about 1.6 nH, C6 about 4.3 pF, L6 about 0.87 nH, C7 about 6 pF, L7 about 1.5 nH and C8 of about 30 pF.

Figure 6:
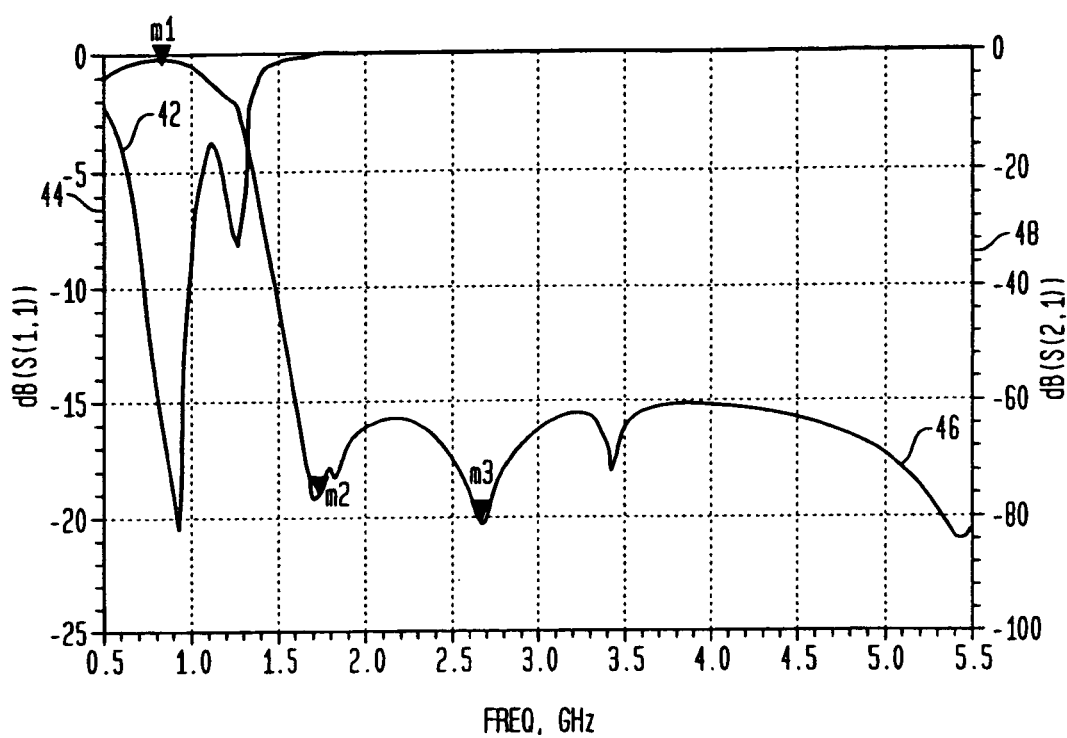
FIG. 6 is a plot of the S11 and S21 scattering parameters versus frequency for the circuit of FIG. 4.

FIG. 6 is a a plot of the S11 and S21 scattering parameters versus frequency for the matching filter circuit with series inductance split resonance of FIG. 4. Comparison of S11 curve 42 to S11 curve 22 of FIG. 4, shows that in the region of the 825 MHz fundamental or transmission frequency, the matching filter with series inductance split resonance has a broader transmission bandwidth than the matching filter with capacitance split shunt resonances of FIG. 2. Additionally, by comparing the S21 curve 46 with the S21 curve 25 of FIG. 3, the improved filtering in the region of 1800 MHz of the matching filter circuit with series inductance split resonance is apparent.

Although the invention has been described in language specific to structural features and/or methodological acts, it is to be understood that the invention defined in the appended claims is not necessarily limited to the specific features or acts described. Rather, the specific features and acts are disclosed as exemplary forms of implementing the claimed invention.

The invention claimed is:

1. An apparatus comprising:
   a first shunt arm comprising a first shunt path and a second shunt path, wherein (i) said first shunt path is connected in parallel with said second shunt path, (ii) said first shunt arm has a first impedance matching capacitance configured to operate at a fundamental frequency, (iii) said first shunt path comprises a first capacitor and a first inductor in series with a series resonance at a first harmonic frequency, and (iv) said second shunt path comprises a second capacitor and a second inductor in series with a series resonance at a second harmonic frequency;
   a series arm comprising a third inductor and a third capacitor, wherein (i) said third inductor is connected in parallel with said third capacitor, (ii) said series arm has a first impedance matching inductance configured to operate at said fundamental frequency; and
   a second shunt arm located between said series arm and an output port of said apparatus, wherein (i) said second shunt arm has a second impedance matching capacitance operating at said fundamental frequency, and (ii) said second shunt arm comprises a fourth capacitor and a fourth inductor in series with a series resonance.

2. The apparatus according to claim 1, wherein said first shunt path provides harmonic rejection of said first harmonic frequency.

3. The apparatus according to claim 1, wherein said second shunt path provides harmonic rejection of said second harmonic frequency.

4. The apparatus according to claim 1, wherein said third capacitor acts as an open circuit at said fundamental frequency and resonates in parallel with said third inductor at a third harmonic frequency.

5. The apparatus according to claim 4, wherein said series arm provides harmonic rejection of said third harmonic frequency.

6. The apparatus according to claim 1, wherein said second shunt arm provides harmonic rejection at a fourth harmonic frequency.

7. The apparatus according to claim 1, wherein said first shunt path and said second shunt path in combination parallel resonate to an open circuit at a frequency substantially equal to said series resonance of said fourth capacitor and said fourth inductor in said second shunt arm.

8. The apparatus according to claim 1, wherein said third inductor and said fourth inductor are in physical proximity, thereby establishing a mutual inductance between said third and fourth inductor.

9. The apparatus according to claim 1, wherein said apparatus is implemented as a monolithic integrated circuit.

10. A method for combining impedance matching and harmonic rejection comprising the steps of:
   (A) implementing a first shunt arm comprising a first shunt path and a second shunt path in parallel, wherein (i) said first shunt arm has a first impedance matching capacitance at a fundamental frequency, (ii) said first shunt path comprises a first capacitor and a first inductor in series with a series resonance at a first harmonic frequency, (iii) said second shunt path comprises a second capacitor and a second inductor in series with a series resonance at a second harmonic frequency, (iv) said first shunt path provides harmonic rejection of said first harmonic frequency and (v) said second shunt path provides harmonic rejection of said second harmonic frequency; and (B) implementing a series arm comprising a third inductor and a third capacitor in parallel, wherein (i) said series arm has a first impedance matching inductance at said fundamental frequency and (ii) said third capacitor acts as an open circuit at said fundamental frequency and parallel resonates with said third inductor at a third harmonic frequency and (iii) said series arm provides harmonic rejection of said third harmonic frequency.

11. The method according to claim 10, further comprising the step of:

(C) implementing a second shunt arm, wherein (i) said second shunt arm has a second impedance matching capacitance at said fundamental frequency, (ii) said second shunt arm comprises a fourth capacitor and a fourth inductor in series with a series resonance at a fourth harmonic frequency, (iii) said second shunt arm provides harmonic rejection at said fourth harmonic frequency and (iv) said first shunt path and said second shunt path in combination parallel resonate to an open circuit at a frequency substantially equal to said series resonance of said fourth capacitor and said fourth inductor in said second shunt arm.

12. The method according to claim 11 further comprising the step of placing said third inductor and said fourth inductor in physical proximity to establish a mutual inductance between said third inductor and fourth inductor.

13. The method according to claim 11, wherein said method is implemented using a monolithic integrated circuit.

* * * * *